United States Patent
Kobayashi et al.

(10) Patent No.: US 10,136,511 B2
(45) Date of Patent: Nov. 20, 2018

(54) CIRCUIT ASSEMBLY AND METHOD FOR MANUFACTURING CIRCUIT ASSEMBLY

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

(72) Inventors: Takehito Kobayashi, Mie (JP); Arinobu Nakamura, Mie (JP); Tou Chin, Mie (JP); Shigeki Yamane, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/519,715

(22) PCT Filed: Oct. 2, 2015

(86) PCT No.: PCT/JP2015/078026
§ 371 (c)(1),
(2) Date: Apr. 17, 2017

(87) PCT Pub. No.: WO2016/063706
PCT Pub. Date: Apr. 28, 2016

(65) Prior Publication Data
US 2017/0238411 A1    Aug. 17, 2017

(30) Foreign Application Priority Data
Oct. 23, 2014 (JP) .................. 2014-216022

(51) Int. Cl.
*H05K 1/02* (2006.01)
*B32B 7/12* (2006.01)
(Continued)

(52) U.S. Cl.
CPC ............. *H05K 1/0204* (2013.01); *B32B 7/12* (2013.01); *B32B 37/12* (2013.01); *C09J 7/22* (2018.01);
(Continued)

(58) Field of Classification Search
CPC ............. H05K 7/2039; H05K 7/20454; H05K 7/20463; H05K 7/20472; H05K 7/205; H05K 1/0201–1/0206
(Continued)

(56) References Cited

U.S. PATENT DOCUMENTS 5,708,566 A * 1/1998 Hunninghaus ....... H05K 1/0206
174/252
6,320,748 B1 * 11/2001 Roden ................... H01L 23/367
165/185
(Continued)

FOREIGN PATENT DOCUMENTS

| JP | 2003164040 A | 6/2003 |
| JP | 2008259286 A | 10/2008 |
| JP | 2015002623 | 1/2015 |

OTHER PUBLICATIONS

Digi-Key-Board-Level-Heatsink Catalog, p. 88.*
(Continued)

*Primary Examiner* — Dion R Ferguson
*Assistant Examiner* — Amir Jalali
(74) *Attorney, Agent, or Firm* — Honigman Miller Schwartz and Cohn LLP

(57) ABSTRACT

A circuit assembly includes a circuit board, a heat dissipation member on which the circuit board is placed and that is
(Continued)

configured to release heat of the circuit board, an insulating layer that is formed on a surface on the circuit board side of the heat dissipation member, a bonding portion made of a bonding agent that is arranged in a predetermined region between the circuit board and the heat dissipation member, and an adhesive portion that is arranged in a region other than the predetermined region between the circuit board and the heat dissipation member and that is made of an adhesive with which the circuit board and the heat dissipation member are bonded to each other with lower bonding force than with the bonding agent.

16 Claims, 7 Drawing Sheets

(51) Int. Cl.

| B32B 37/12 | (2006.01) |
|---|---|
| C09J 9/00 | (2006.01) |
| C09J 163/00 | (2006.01) |
| H05K 1/18 | (2006.01) |
| H05K 3/00 | (2006.01) |
| C09J 7/38 | (2018.01) |
| C09J 7/22 | (2018.01) |

(52) U.S. Cl.
CPC . *C09J 7/38* (2018.01); *C09J 9/00* (2013.01); *C09J 163/00* (2013.01); *H05K 1/181* (2013.01); *H05K 3/0058* (2013.01); *B32B 2457/08* (2013.01); *C09J 2203/326* (2013.01); *H05K 2201/066* (2013.01); *H05K 2201/10272* (2013.01); *H05K 2201/10598* (2013.01); *H05K 2203/0522* (2013.01)

(58) Field of Classification Search
USPC .............. 361/709, 711, 713, 719, 720; 165/80.1–80.2
See application file for complete search history.

(56) References Cited

U.S. PATENT DOCUMENTS

| 6,714,414 B1* | 3/2004 | Dubovsky | H01L 23/4006 165/185 |
|---|---|---|---|
| 7,800,220 B2* | 9/2010 | Marz | H01L 23/473 165/104.33 |
| 7,983,048 B2* | 7/2011 | Sasaki | H01L 23/3677 165/104.33 |
| 8,587,945 B1* | 11/2013 | Hartmann | H05K 7/20454 361/679.53 |
| 2005/0099778 A1* | 5/2005 | Nakanishi | H05K 3/0061 361/704 |
| 2006/0180821 A1* | 8/2006 | Fan | F21K 9/00 257/98 |
| 2009/0273076 A1* | 11/2009 | Choi | H01L 23/49838 257/702 |
| 2010/0091464 A1* | 4/2010 | Ohnishi | H01L 23/053 361/723 |
| 2011/0194255 A1* | 8/2011 | Yamashita | B23K 1/0016 361/711 |
| 2013/0003306 A1* | 1/2013 | Oota | B60R 16/0239 361/709 |

OTHER PUBLICATIONS

Digi-Key TG-LH-EE-90-2 Epoxy Resin, Thermal Management, p. 1.*
Search Report for International Application No. PCT/JP2015/078026, dated Nov. 24, 2015, 2 pgs.

* cited by examiner

CIRCUIT ASSEMBLY AND METHOD FOR MANUFACTURING CIRCUIT ASSEMBLY

CROSS-REFERENCE TO RELATED APPLICATIONS

This application is the U.S. national stage of PCT/JP2015/078026 filed Oct. 2, 2015, which claims priority of Japanese Patent Application. No. JP 2014-216022 filed Oct. 23, 2014.

FIELD OF THE INVENTION

The present invention relates to a circuit assembly and a method for manufacturing a circuit assembly.

BACKGROUND ART

Conventionally, circuit assemblies are known in which a circuit board and a heat dissipation member that is configured to release heat of this circuit board outward are stacked one upon the other. In this type of circuit assembly, a circuit board is bonded to the top of a heat dissipation member with an adhesive. In JP 2005-151617A, a sheet-like member obtained by weaving insulated fibers into a sheet shape is placed on an adhesive that has been applied to the top of a heat dissipation member, and the adhesive substantially uniformly permeates the entire sheet-like member. Then, a circuit member is placed on this sheet-like member and pressed toward the heat dissipation member, and the circuit member is thus fixed to the top of the heat dissipation member.

BACKGROUND

In JP 2005-151617A, during fixing of the circuit member to the heat dissipation plate, the circuit member is pressed toward the heat dissipation plate. If the force for pressing the circuit member is nonuniform, there is a risk that the adhesion of the adhesive will be insufficient depending on the location, and thus the circuit member will separate from the heat dissipation plate, resulting in a decrease in heat dissipation properties. Here, a jig for pressing the circuit member with uniform force can be used to press the circuit member against the heat dissipation plate, but, in this case, there is a problem in that manufacturing cost of the circuit assembly increases due to not only the need for preparing the jig but also the time it takes to conduct operations using the jig.

The present invention was accomplished based on the above-mentioned circumstances, and it is an object thereof to provide a circuit assembly that enables the circuit board and the heat dissipation member to be bonded to each other at reduced manufacturing cost.

SUMMARY OF INVENTION

A circuit assembly of the present invention includes a circuit board, a heat dissipation member on which the circuit board is placed and that is configured to release heat of the circuit board, an insulating layer that is formed on a surface on the circuit board side of the heat dissipation member, a bonding portion made of a bonding agent that is arranged in a predetermined region between the circuit board and the heat dissipation member, and an adhesive portion that is arranged in a region other than the predetermined region between the circuit board and the heat dissipation member and that is made of an adhesive with which the circuit board and the heat dissipation member are bonded to each other with lower bonding force than with the bonding agent.

A method for manufacturing a circuit assembly of the present invention includes forming an insulating layer on a surface of a heat dissipation member, providing a bonding agent in a predetermined region on the insulating layer, providing an adhesive with which a circuit board and the heat dissipation member are bonded to each other with lower bonding force than with the bonding agent in a region other than the predetermined region, and bonding the circuit board and the heat dissipation member to each other.

When the circuit board and the heat dissipation member are bonded to each other using only an adhesive, there is generally a problem in that it is necessary to apply pressure to the circuit board and the heat dissipation member for a long time using a jig or the like, resulting in an increase in manufacturing cost. With the present configuration, the bonding agent with which the circuit board and the heat dissipation member are bonded to each other with higher bonding force than with the adhesive is provided to the predetermined region between the circuit board and the heat dissipation member, and therefore, when the circuit board and the heat dissipation member are bonded to each other, a state in which the circuit board and the heat dissipation member are bonded to each other can be maintained by the bonding force of the bonding agent. This makes it possible to reduce operations for applying pressure to the circuit board and the heat dissipation member, and thus a manufacturing process can be simplified. Therefore, the circuit board and the heat dissipation member can be bonded to each other at reduced manufacturing cost.

Here, there is a concern that when the circuit board and the heat dissipation member are bonded to each other by applying a bonding agent or an adhesive therebetween, the bonding agent or the adhesive is collapsed and deformed by applying pressure to the circuit board and the heat dissipation member from both sides, resulting in a decrease in insulation between the circuit board and the heat dissipation member. With the present configuration, the insulating layer is formed on the surface on the circuit board side of the heat dissipation member, and therefore, even when the bonding agent or the adhesive is collapsed and deformed, the insulation between the circuit board and the heat dissipation member can be maintained by the insulating layer. This makes it possible to suppress a decrease in insulation caused by pressure applied when the circuit board and the heat dissipation member are bonded to each other.

The following embodiments are preferred as embodiments of the present invention.

The insulating layer is made of an adhesive that is the same as the adhesive.

With this configuration, the number of components can be reduced, and the manufacturing process can be simplified.

The adhesive is an epoxy resin-based adhesive.

The adhesive is a heat dissipation adhesive having high heat conductivity.

With this configuration, heat of the circuit board can be released via the heat dissipation adhesive.

An electronic component is mounted on the circuit board, and the heat dissipation adhesive is provided in a region over which the electronic component is located.

With this configuration, heat of the electronic component can be released via the heat dissipation adhesive.

The circuit board includes an insulating board obtained by forming a conductive path on an insulating plate, and a busbar made of a metal on which the insulating board is placed, and the adhesive is in intimate contact with the busbar.

With the present invention, the circuit board and the heat dissipation member can be bonded to each other at reduced manufacturing cost.

DETAILED DESCRIPTION OF THE PREFERRED EMBODIMENTS

An embodiment will be described with reference to FIGS. 1 to 7.

A circuit assembly 10 is arranged on a power supply path between a power supply such as a battery of a vehicle and loads constituted by in-vehicle electrical equipment such as a lamp and a wiper, for example, and can be used in a DC-DC converter, an inverter, or the like, "Vertical direction" in the following description refers to the vertical direction in FIG. 2.

Circuit Assembly 10

Figure 2:
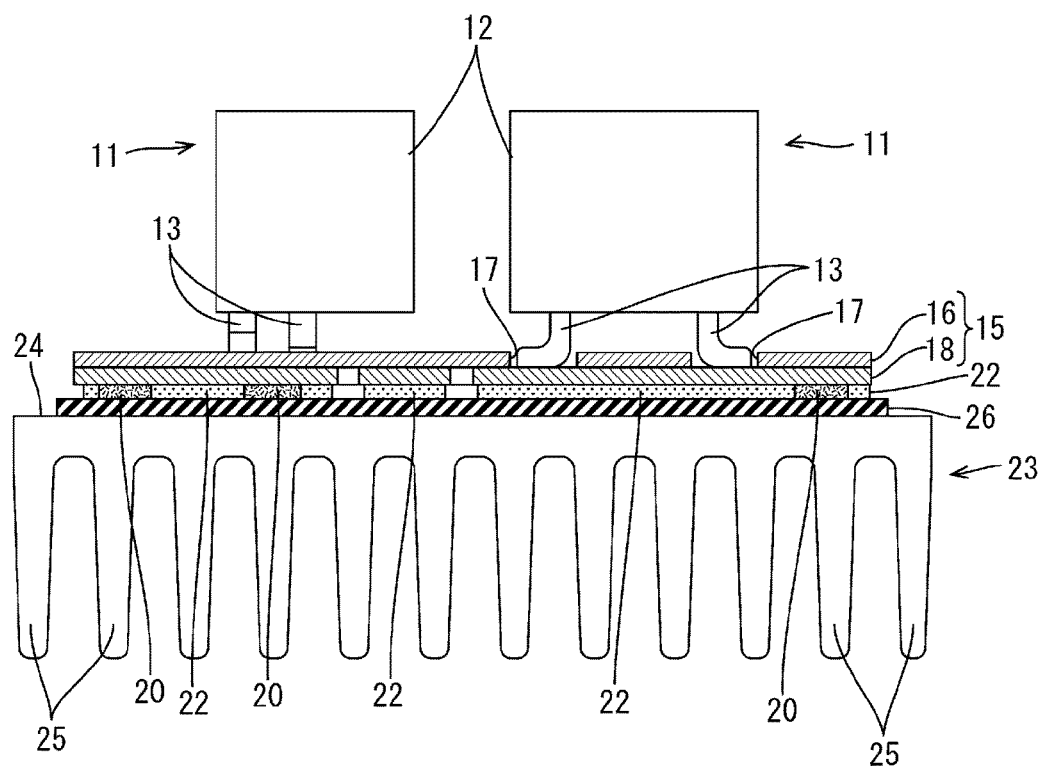
FIG. 2 is a cross-sectional view taken along line A-A in FIG. 1.

As shown in FIG. 2, the circuit assembly 10 includes a circuit hoard 15 on which electronic components 11 are mounted, a heat dissipation member 23 on which the circuit board 15 is placed and that is configured to release heat of the circuit board 15, an insulating layer 26 that is formed on a surface on the circuit board 15 side of the heat dissipation member 23, bonding portions 20 that are arranged between the circuit board 15 and the heat dissipation member 23, and adhesive portions 22 that are arranged, between the circuit board 15 and the heat dissipation member 23, in regions different from the regions in which the bonding portions 20 are arranged.

For example, each of the electronic components 11 may be constituted by a switching element such as a relay and includes a box-shaped main body 12 and a plurality of lead terminals 13. The main body 12 has a rectangular parallelepiped shape, and the lead terminals 13 projects from the bottom surface of the main body 12. The lead terminals 13 are soldered to conductive paths of the circuit board 15 or a busbar 18.

Circuit Board 15

Figure 1:
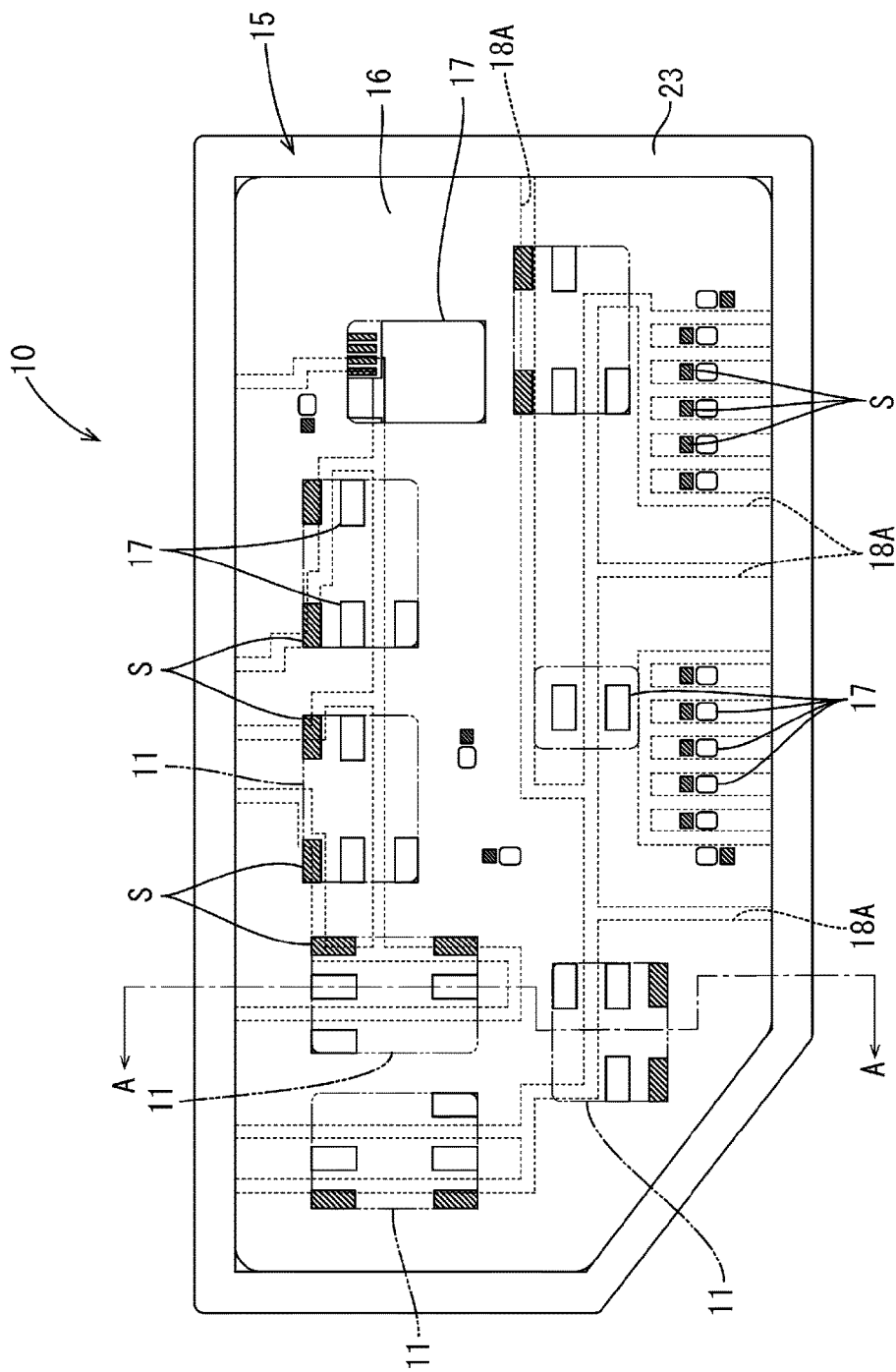
FIG. 1 is a plan view showing a circuit assembly of an embodiment.
Figure 3:
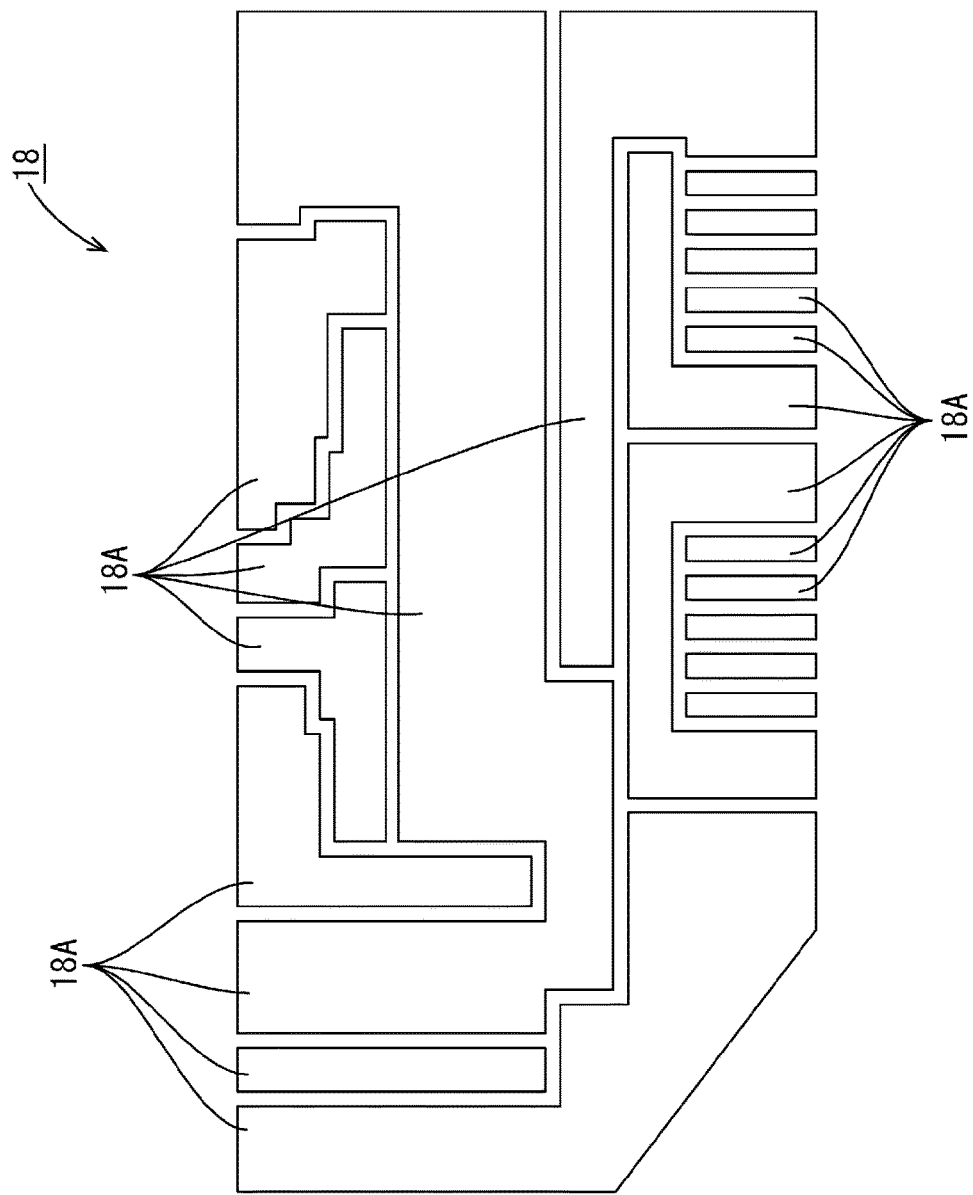
FIG. 3 is a plan view showing a busbar.

As shown in FIGS. 1 and 2, the circuit board 15 has a rectangular shape in which one corner portion is cut out and that is configured by bonding an insulating board 16 and the busbar 18 to each other using an adhesive member (e.g., an adhesive sheet or an adhesive). On the insulating board 16, conductive paths (not shown) made of copper foil or the like are formed on an insulating plate made of an insulating material through printed wiring. Through holes 17 used to solder the lead terminals 13 of the electronic components 11 to the busbar 18 are formed in this insulating board 16. It should be noted that, in FIG. 1, the electronic components 11 are omitted from the diagram, and connection portions S where the lead terminals 13 and the conductive paths of the insulating board 16 are connected are shown by hatching. As shown in FIG. 3, the busbar 18 is constituted by a plurality of plate-shaped separate members 18A that are formed by punching out a metal plate material made of copper, a copper alloy, or the like into the shapes of the conductive paths and arranged on the same plane with certain intervals therebetween.

Heat Dissipation Member 23

The heat dissipation member 23 is made of a metal material such as an aluminum alloy having high heat conductivity. As shown in FIG. 2, the heat dissipation member 23 includes a flat top surface 24 having a size that allows the entire circuit board 15 to be mounted thereon, and further includes, on the bottom surface side, a plurality of heat dissipation fins 25 that are arranged so as to be lined up like comb teeth.

Bonding Portion 20

The bonding portions 20 are formed by curing a bonding agent 20A through heating and have insulating properties. The bonding portions 20 are arranged in predetermined regions on the insulating layer 26 between the circuit board 15 and the heat dissipation member 23. Specifically, the bonding portions 20 are formed in a circular shape and arranged in predetermined regions, that is, a plurality of regions that are respectively located close to corner portions and peripheral edge portions of the separate members 18A (see FIG. 6).

The bonding agent 20A is an instant adhesive (fast curing adhesive material) constituted by an epoxy adhesive, a cyanoacrylate-based adhesive, or the like, and an adhesive is used that is cured through heating in a shorter time than an adhesive 22A is.

Adhesive Portion 22

The adhesive portions 22 are formed by curing an adhesive 22A through heating and have insulating properties. The adhesive portions 22 are arranged in regions on the top surface of the insulating layer 26 in which the bonding portions 20 are not arranged (regions other than the predetermined regions), between the circuit hoard 15 and the heat dissipation member 23. These adhesive portions 22 are made of a heat dissipation adhesive having high heat conductivity. The adhesive 22A is in a liquid form prior to heating, and a heat curing epoxy adhesive (epoxy resin-based adhesive) is used that is cured through heating (e.g., at 110° C.) in a constant temperature chamber. It should be noted that "epoxy-based adhesive" refers to an adhesive obtained by curing a compound having an epoxy group by using an amine, an acid anhydride, or the like. When the circuit board 15 and the heat dissipation member 23 are bonded to each other, the bonding force (force for maintaining a bonded state in which the circuit board 15 and the heat dissipation member 23 are bonded to each other) generated by this adhesive 22A prior to heating is lower than that generated by the bonding agent 20A, It should be noted that the bonding force is determined depending on the adhesive property, the bonding property, the area, the thickness, and the like of the adhesive 22A and the bonding agent 20A.

An adhesive that has insulating properties and has high heat conductivity prior to and subsequent to heating is used as the adhesive 22A. The heat conductivity rate of the adhesive 22A can be set to 3.2 W/m·K. The bonding agent 20A is applied such that its thickness prior to heating is larger than the thickness of the adhesive 22A (see FIG. 7).

When the circuit board 15 is placed on the bonding portions 20 and the adhesive 22A, and the circuit board 15 and the heat dissipation member 23 are sandwiched from the upper and lower sides to apply pressure therebetween, accommodation holes 21 are filled with the bonding agent 20A, and thus the thickness of the bonding agent 20A becomes equal to that of the adhesive 22A. The main body 12 of the electronic component 11 is arranged above the adhesive 22A (passing through a region that is located over the adhesive 22A), and heat of the electronic component 11 is conducted to the heat dissipation member 23 via the adhesive 22A located below the electronic component 11 and released outward from the heat dissipation member 23.

A description of a method for manufacturing the circuit assembly 10 is given below.

Circuit Board Forming Step

The circuit board 15 is formed by bonding the insulating board 16 and the busbar 18 with an adhesive member. Then, the electronic components 11 and the like are mounted on the circuit board 15 by reflow soldering.

Insulating Layer Forming Step

Figure 4:
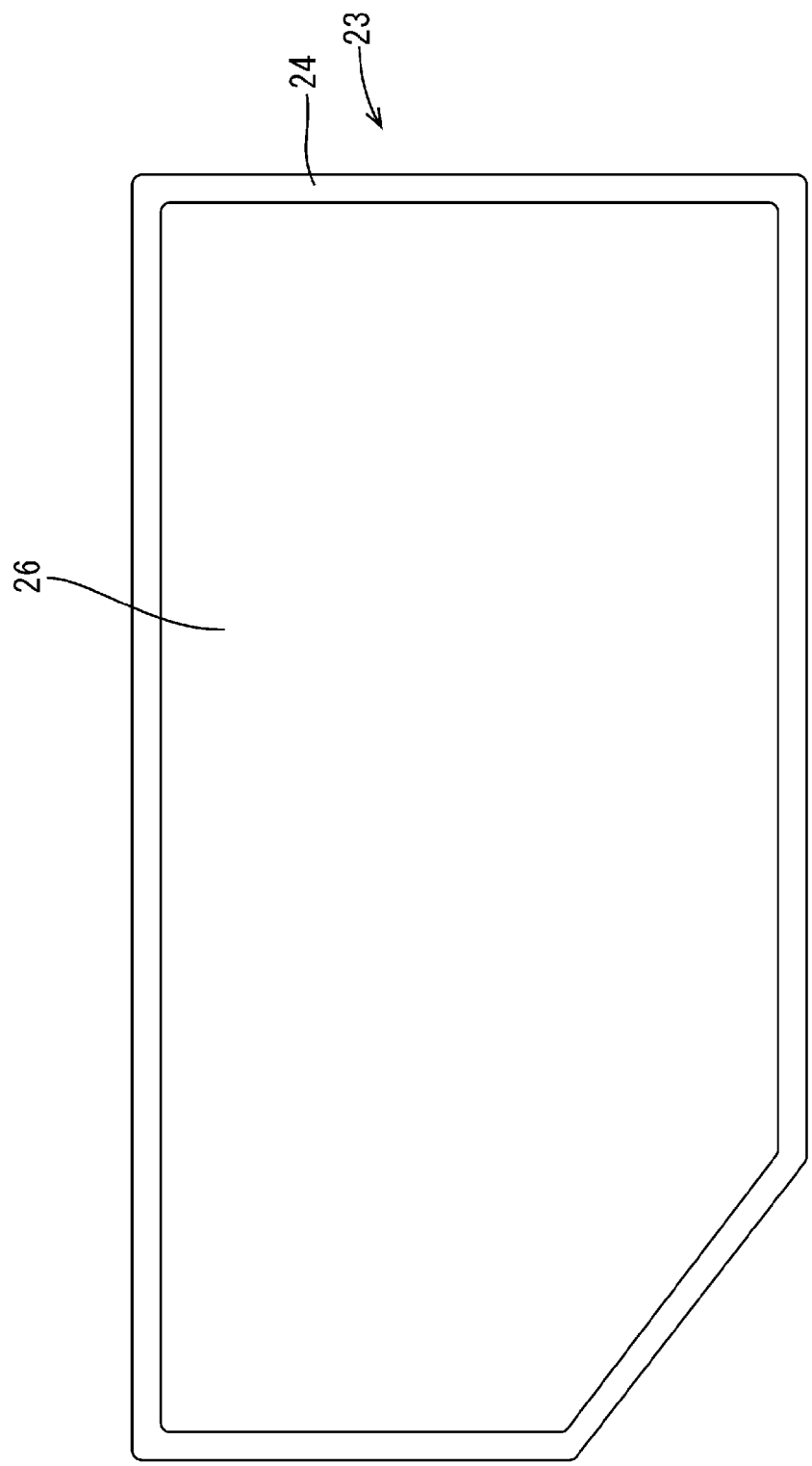
FIG. 4 is a plan view showing a state in which an insulating layer is formed on the heat dissipation member.

Next, an adhesive that is the same as the adhesive 22A is applied to substantially the entire top surface 24 of the heat dissipation member 23 excluding the edge portions. The heat dissipation member 23 is passed through a heating furnace and heated at a first heating temperature TA for a first heating time T1 (e.g., 30 minutes), and thus the adhesive is cured to form the insulating layer 26 (FIG. 4).

Bonding Agent and Adhesive Applying Step

Figure 5:
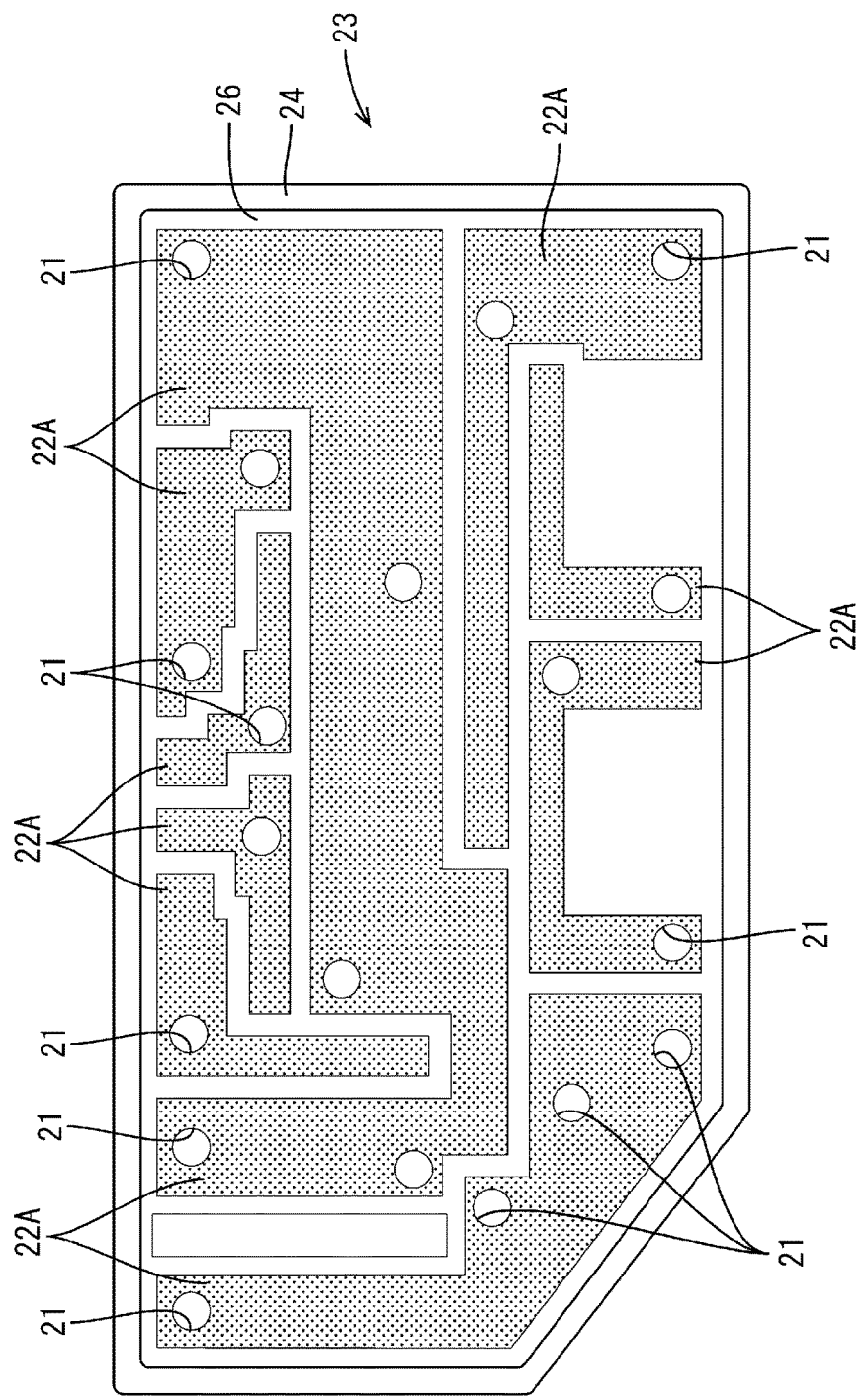
FIG. 5 is a plan view showing a state in which an adhesive is applied to the top of the insulating layer.
Figure 6:
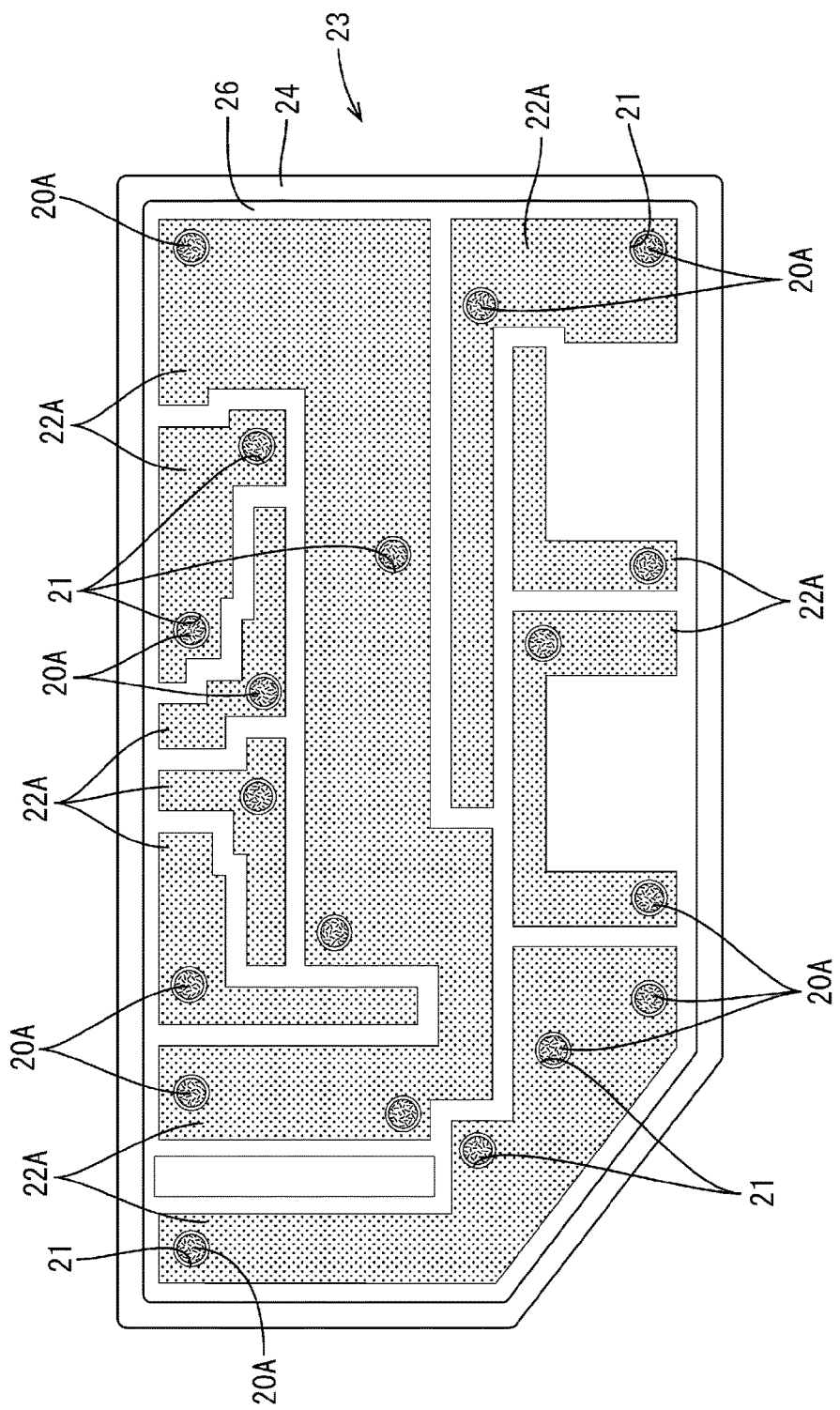
FIG. 6 is a plan view showing a state in which a bonding agent is applied to the inside of accommodation holes in the adhesive on the insulating layer.
Figure 7:
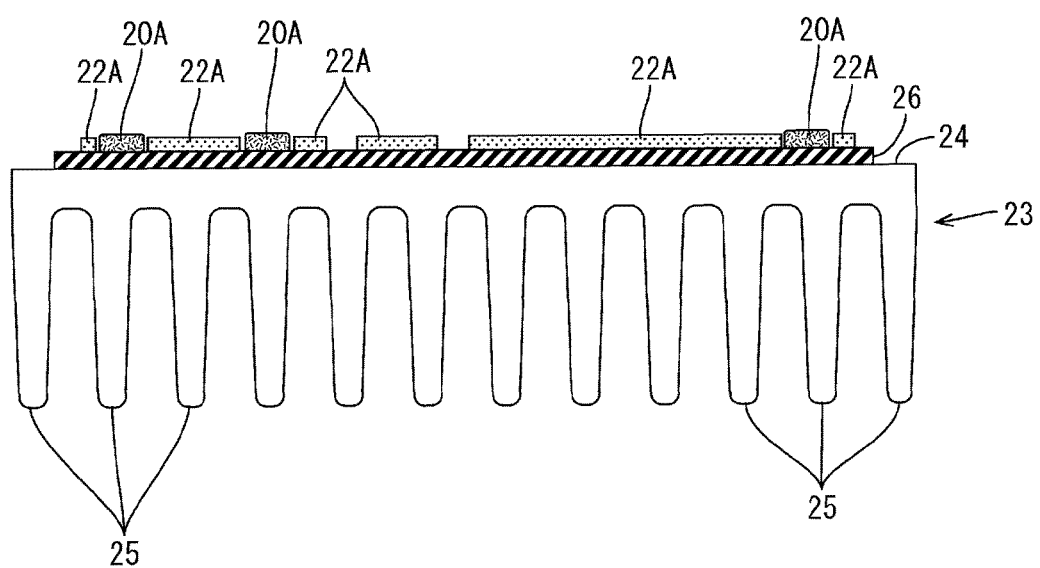
FIG. 7 is a cross-sectional view of FIG. 6 taken along a position corresponding to line A-A in FIG. 1.

Next, the adhesive 22A is applied to regions other than predetermined regions (accommodation holes 21) on the insulating layer 26 (FIG. 5). The bonding agent 20A is applied to the predetermined regions (accommodation holes 21) with small intervals from the adhesive 22A (FIG. 6).

Pressure Applying and Heating Step

The circuit assembly is sandwiched from the upper and lower sides using an apparatus for applying pressure (e.g., an apparatus including metal molds between which the circuit assembly is sandwiched) to press the circuit board 15 and the heat dissipation member 23. Accordingly, the circuit board 15 and the heat dissipation member 23 are relatively firmly bonded to each other with the bonding force of the bonding portion 20. Then, the circuit assembly is heated in a heating furnace at a second heating temperature TB that is lower than the first heating temperature TA for a second heating time T2 (e.g., 5 minutes) that is shorter than the first heating time T1.

Heating Step

Next, the circuit assembly 10 is removed from the apparatus for applying pressure, and heated at a third heating temperature TC (TC<TB<TA) that is lower than the second heating temperature TB for a third heating time T3 (e.g., 90 minutes: T2<T1<T3) that is longer than the second heating time T2. Accordingly, the adhesive 22A is cured, and the circuit assembly 10 is thus formed. This circuit assembly 10 is accommodated in a case (not shown) to serve as an electrical junction box (not shown), and arranged on a path between a power supply of a vehicle and loads.

With the aforementioned embodiment, the following operations and effects are exhibited.

When the circuit board 15 and the heat dissipation member 23 are bonded to each other using only the adhesive 22A, there is generally a problem in that it is necessary to apply pressure to the circuit board 15 and the heat dissipation member 23 using a jig or the like, resulting in an increase in manufacturing cost. With this embodiment, the bonding agent 20A with which the circuit board 15 and the heat dissipation member 23 is bonded to each other with higher bonding force than with the adhesive 22A is provided to a predetermined region between the circuit board 15 and the heat dissipation member 23, and therefore, when the circuit board 15 and the heat dissipation member 23 are bonded to each other, a state in which the circuit board 15 and the heat dissipation member 23 are bonded to each other can be maintained by the bonding force of the bonding agent 20A. This makes it possible to reduce operations for applying pressure to the circuit board 15 and the heat dissipation member 23, and thus a manufacturing process can be simplified.

Here, there is a concern that when the circuit board 15 and the heat dissipation member 23 are bonded to each other with the bonding agent 20A or the adhesive 22A, the bonding agent 20A or the adhesive 22A is collapsed and deformed when pressure is applied during bonding, resulting in a decrease in insulation between the circuit board 15 and the heat dissipation member 23. With the present configuration, the insulating layer 26 is formed on the surface on the circuit board 15 side of the heat dissipation member 23, thus making it possible to suppress a decrease in insulation caused by pressure applied when the circuit board 15 and the heat dissipation member 23 are bonded to each other, or the like.

The insulating layer 26 is made of an adhesive that is the same as the adhesive 22A.

With this configuration, the number of components can be reduced, and the manufacturing process can be simplified.

The adhesive 22A is a heat dissipation adhesive having high heat conductivity.

With this configuration, heat of the circuit board 15 can be released via the heat dissipation adhesive.

Furthermore, the electronic component 11 is mounted on the circuit board 15, and the adhesive 22A (heat dissipation adhesive) is provided in a region over which the electronic component 11 is located.

With this configuration, heat of the electronic component 11 can be released via the heat dissipation adhesive.

The circuit board 15 includes the insulating board 16 obtained by forming a conductive path on an insulating plate, and the busbar 18 made of a metal on which the insulating board 16 is placed, and the adhesive 22A is in intimate contact with the busbar 18.

With this configuration, the adhesive 22A is brought into intimate contact with the busbar 18, thus making it possible to improve the heat dissipation properties.

Other Embodiments

The present invention is not limited to the embodiment that has been described above with reference to the drawings, and embodiments such as those described below are also included in the technical scope of the present invention, for example.

(1) The bonding agent 20A and the adhesive 22A are not limited to the bonding agent and the adhesive of the above-mentioned embodiment, and various bonding agents and adhesives can be used. The material of the insulating layer 26 is not limited to the same adhesive as the adhesive 22A, and various insulating materials can be used.

(2) The electronic component 11 is not limited to a relay (e.g., mechanical relay or FET), and various electronic components that generate heat due to the application of electricity.

(3) A region (space) in which the bonding agent 20A or the adhesive 22A is not provided may be formed in the region between the circuit board 15 and the heat dissipation member 23.

(4) The circuit board 15 and the heat dissipation member 23 may be fixed to each other through screwing in addition to bonding with the bonding agent 20A and the adhesive 22A.

(5) Although the bonding agent 20A and the adhesive 22A are applied to the top of the insulating layer 26 in the above-mentioned embodiment, there is no limitation thereto, and one or both of the bonding agent 20A and the adhesive 22A may be applied to (not the top of the insulating layer 26 but) the busbar 18 (surface on the heat dissipation member 23 side) at corresponding positions on the circuit board 15 (at positions on the circuit board 15 corresponding to the bonding agent 20A and the adhesive 22A of the above-mentioned embodiment).

The invention claimed is:

1. A circuit assembly comprising:
a circuit board;
a heat dissipation member on which the circuit board is placed and that is configured to release heat of the circuit board;
an insulating layer that is formed on a surface on the circuit board side of the heat dissipation member;
a bonding portion made of a bonding agent that is arranged in a predetermined region between the circuit board and the heat dissipation member; and
an adhesive portion that is arranged in a region other than the predetermined region between the circuit board and the heat dissipation member, so as to have a same thickness of the bonding and be generally coplanar with the bonding portion, wherein the adhesive portion is made of an adhesive with which the circuit board and the heat dissipation member are bonded to each other with lower bonding force than with the bonding agent.

2. The circuit assembly according to claim 1, wherein the insulating layer is made of an adhesive that is the same as the adhesive.

3. The circuit assembly according to claim 1, wherein the adhesive is an epoxy resin-based adhesive.

4. The circuit assembly according to claim 1, wherein the adhesive is a heat dissipation adhesive having high heat conductivity.

5. The circuit assembly according to claim 4, wherein an electronic component is mounted on the circuit board, and the heat dissipation adhesive is provided in a region over which the electronic component is located.

6. The circuit assembly according to claim 1, wherein the circuit board includes an insulating board obtained by forming a conductive path on an insulating plate, and a busbar made of a metal on which the insulating board is placed, and the adhesive is in intimate contact with the busbar.

7. The circuit assembly according to claim 2, wherein the adhesive is an epoxy resin-based adhesive.

8. The circuit assembly according to claim 2, wherein the adhesive is a heat dissipation adhesive having high heat conductivity.

9. The circuit assembly according to claim 3, wherein the adhesive is a heat dissipation adhesive having high heat conductivity.

10. The circuit assembly according to claim 2, wherein the circuit board includes an insulating board obtained by forming a conductive path on an insulating plate, and a busbar made of a metal on which the insulating board is placed, and the adhesive is in intimate contact with the busbar.

11. The circuit assembly according to claim 3, wherein the circuit board includes an insulating board obtained by forming a conductive path on an insulating plate, and a busbar made of a metal on which the insulating board is placed, and the adhesive is in intimate contact with the busbar.

12. The circuit assembly according to claim 4, wherein the circuit board includes an insulating board obtained by forming a conductive path on an insulating plate, and a busbar made of a metal on which the insulating board is placed, and the adhesive is in intimate contact with the busbar.

13. The circuit assembly according to claim 5, wherein the circuit board includes an insulating board obtained by forming a conductive path on an insulating plate, and a busbar made of a metal on which the insulating board is placed, and the adhesive is in intimate contact with the busbar.

14. The circuit assembly according to claim 1, wherein the bonding portion is disposed within an opening of the adhesive portion and wherein an outer peripheral edge of the bonding portion is enclosed by and in contact with an inner peripheral edge of the adhesive portion defining the opening.

15. A method for manufacturing a circuit assembly, the method comprising:
forming an insulating layer on a surface of a heat dissipation member;
providing a bonding agent in a predetermined region on the insulating layer;
providing an adhesive with which a circuit board and the heat dissipation member are bonded to each other with lower bonding force than with the bonding agent in a region other than the predetermined region so as to place the bonding agent and the adhesive along a plane of the insulating layer; and
bonding the circuit board and the heat dissipation member to each other, by pressing the circuit board against the heat dissipation member, wherein the bonding portion and the adhesive portion form the same thickness.

16. The method set forth in claim 15, further comprising the step of pressing the circuit board against the heat dissipation member wherein the bonding portion is compressed and expanded radially so as to place an outer peripheral edge of the bonding portion in contact with an inner peripheral edge defining an opening of the adhesive portion.

* * * * *